United States Patent [19]
Masuda et al.

[11] Patent Number: 5,843,620
[45] Date of Patent: Dec. 1, 1998

[54] IMAGE-FORMING MATERIAL

[75] Inventors: Tetsuya Masuda; Hideaki Mochizuki; Junko Tadano, all of Yokohama; Kiyoshi Goto; Miyuki Hosoi, both of Tokyo, all of Japan

[73] Assignees: Konica Corporation; Mitsubishi Chemical Corporation, both of Tokyo, Japan

[21] Appl. No.: 662,020

[22] Filed: Jun. 12, 1996

[51] Int. Cl.⁶ ........................................... G03F 7/30
[52] U.S. Cl. ................ 430/258; 430/143; 430/257; 430/262; 430/263
[58] Field of Search ................. 430/260, 273.1, 430/257, 143, 293, 262, 263, 258

[56] References Cited

U.S. PATENT DOCUMENTS

| | | | |
|---|---|---|---|
| 5,001,036 | 3/1991 | Choi | 430/262 |
| 5,436,106 | 7/1995 | Mohr et al. | 430/257 |
| 5,443,937 | 8/1995 | Bodager et al. | 430/257 |
| 5,563,023 | 10/1996 | Kangas et al. | 430/143 |
| 5,565,301 | 10/1996 | Bodager | 430/257 |
| 5,597,677 | 1/1997 | Kangas et al. | 430/143 |
| 5,635,331 | 6/1997 | Kangas et al. | 430/143 |

FOREIGN PATENT DOCUMENTS 7-92664  4/1995  Japan.

*Primary Examiner*—John S. Chu
*Attorney, Agent, or Firm*—Oblon, Spivak, McClelland, Maier & Neustadt, P.C.

[57] ABSTRACT

An image-forming material comprises;
 a support; and
 a release layer, a sensitive coloring layer, an overcoat layer containing a release agent, remains on the sensitive coloring layer side when the protective film is peel away, and a protective film disposed successively in this order on the support.

12 Claims, No Drawings

IMAGE-FORMING MATERIAL

BACKGROUND OF THE INVENTION

The present invention relates to a color image-forming material which is suited for making color proofs for color correction of color prints. More particularly it relates to a color image-forming material which is capable of forming an image strikingly close to the original (printing resemblance) and also enables easy handling of the color sheet and accurate register (handling property).

In multicolor printing, color correction by proof printing is generally conducted as a pre-step to the actual printing process. A photosensitive transfer sheet (color proofing sheet) for color correction can be obtained by exposing an image-forming material through the color separation films for the respective color plates, developing the exposed material to form a color-separated image on a sensitive layer, and then transferring this color-separated image onto an appropriate transfer material. A multicolor image can be obtained by repeating the step of transferring the color-separated images of different colors onto the transfer material on which the first color-separated image has been transferred.

As methods for forming a multicolor transferred image by using color sheets for color correction, there are known, for example, a direct transfer method in which the color images are directly transferred and laminated on a final image-receiving paper (Japanese Patent Application Laid-Open (KOKAI) No. 47-41830), an indirect transfer method in which the color images are temporarily transferred onto a provisional image receiving sheet (Japanese Patent Application Laid-Open (KOKAI) No. 59-97140), and a method in which the step of forming the image on an image-receiving paper after transfer thereto of the sensitive coloring layer is repeated (Japanese Patent Application Laid-Open (KOKAI) No. 56-50127).

Any of these known methods, however, involved the problem that the gloss of the produced image surface is too high, thereby giving a different impression from the image quality in actual printing, since the surface of the transfer material on which an image has been formed is coated with an organic polymer.

In order to solve this problem, an "only-image transfer method" has been proposed in which the color images alone are transferred and laminated on a transfer material by using an image-forming material having a sensitive coloring layer provided releasably on a support to form a multicolor image. According to this method, it is possible to obtain an image closely approximate to the image quality in actual printing, since the transfer material has no coating of an organic polymer.

As for the image-forming material used in this only-image transfer method, it is desirable to lower the softening point of the sensitive coloring layer, thereby improving adhesiveness for facilitating transfer of the image alone from the support onto the transfer material. In this case, however, the mechanical strength of the sensitive layer is reduced and also a physical pressure is exerted when the color separation films for the respective color plates are attached fast to the image-forming material during exposure, so that there arises the problem that the overcoat layer and the sensitive coloring layer might be forced to deform, thereby causing the final image to be defective. Also, when a sensitive coloring layer is coated on a release layer formed on a support, and after drying, an overcoat layer is provided thereon, followed by lamination of a sheet, the said overcoat layer lies on the side of the image-forming material opposite from the sensitive layer, and as a result, the interlaminar blocking may occur during storage in spite of the presence of the overcoat layer.

As a means for solving these problems, it has been proposed to provide a release layer, a sensitive coloring layer, an overcoat layer and a protective film in that order on a support (Japanese Patent Application Laid-open (KOKAI) No. 7-92666). However, in the case of an image-forming material of a structure having a protective film laminated on the overcoat layer, since it is necessary to peel the protective film at the protective film/overcoat layer interface after exposure and to conduct development of the now exposed overcoat layer exfoliation of parts other than the protective film/overcoat layer interface occurs when the protective film is peeled, resulting in a partial loss of the final image. Also, since the image-forming material is electrically charged as a result of peeling of the protective film, which generates electrostatic charge, the image-forming material may be entangled on the treating equipment in the ensuing transfer step. Further, great difficulties were involved in forming a uniform overcoat layer.

As a result of the earnest present inventors' studies for overcoming these problems, it has been found that by incorporating a release agent in the overcoat layer of an image-forming material comprising a release layer, a sensitive coloring layer, an overcoat layer and a protective film provided successively on a support, it is possible to form a stabilized multicolor image without causing partial loss of the image and electrostatic charge generation when the protective film is peeled. The present invention has been attained on the basis of this finding.

SUMMARY OF THE INVENTION

The object of the present invention is to provide an image-forming material capable of forming a stabilized multicolor image without giving rise to such problems as formation of defective image and peel charge even when adhesiveness of the sensitive coloring layer is elevated.

To accomplish the aims, in an aspect of the present invention, there is provided an image-forming material comprising;

a support; and a release layer, a sensitive coloring layer, an overcoat layer containing a release agent, which remains on the sensitive layer side of the image-forming material when the protective film is peeled away, and a protective film provided successively in that order on the support.

DETAILED DESCRIPTION OF THE INVENTION

The present invention will be described in more detail herein below.

The support used in the present invention is preferably transparent for allowing exposure from the side of the support where no sensitive layer is provided, but the support may be made of a known material which has enough resistance against the developer used and sufficient dimension stability to heat. For instance, films of synthetic resins, for example, polyolefins such as polypropylene, polyesters such as polyethylene terephthalate, polybutylene terephthalate and polyethylene naphthalate, polyamides such as nylon 6 and nylon 6/6, polyester amides, polycarbonates, polyether ketones, and copolymers or mixtures thereof maybe used. As to polyesters, polyester resins obtained by reacting aromatic dicarboxylic acids or esters thereof and glycols as the main starting materials, especially resins in which not less than 80% of the repeating structural units are constituted of ethylene terephthalate or ethylene-2,6-naphthalate, are examples. As a comonomer component of this polyester, an aromatic dicarboxylic acid such as isophthalic acid, phthalic acid, adipic acid, sebasic acid or the like; an oxycarboxylic acid such as p-oxyethoxybenzoic acid, p-oxybenzoic acid or the like; and a glycol such as diethylene glycol, propylene glycol, butane glycol, cyclohexane dimethanol, neopentyl glycol or the like may be exemplified. A film of a homopolyethylene terephthalate, especially a biaxially stretched polyethylene terephthalate film is most preferred.

The support used in the present invention is preferably one which is small in both of maximum thermal expansion coefficient and angle of orientation for minimizing the positional deviation because of the difference in thermal expansion coefficient between the longitudinal and transverse directions in the transfer operation.

Inorganic particles such as silica, alumina, kaolin, talc or the like may be incorporated in the support of the present invention for improving its handling properties. The support thickness is not specified in the present invention, but it is preferably in the range from 10 to 300 μm, more preferably 50 to 150 μm, in view of mechanical strength and heat conduction in the transfer operation.

In the present invention, a release layer is disposed on the support for improving transfer characteristics of the image formed on the support. This release layer is composed of copolymers containing vinyl acetate as copolymer unit, such as ethylene-vinyl acetate copolymer, ethylene-propylene-vinyl acetate copolymer, and modified copolymers thereof. Ethylene-vinyl acetate copolymer containing ethylene and vinyl acetate as copolymer units and having a softening point of 50° to 120° C., is preferred in terms of the transfer characteristics.

Various methods are available for forming a release layer by using an ethylene-vinyl acetate copolymer and, for example, a method of coating and drying as shown in Japanese Patent Application Laid-open (KOKAI) No. 3-181947, a dry lamination method, a hot melt lamination method and a coextrusion method may be used.

The release layer may contain materials such as disclosed in Japanese Patent Application Laid-open (KOKAI) Nos. 51-5101, 59-97140 and 63-2040, for example, alcohol-soluble polyamides, alcohol-soluble nylons, blends of partially esterified resins of styrene-maleic anhydride copolymer and methoxymethylated nylons, polymers of acrylic acid and its derivatives, polyvinyl chloride, polyvinyl butyrate, cellulose acetate, and the like.

Thickness of the release layer is preferably 5 to 200 μm, more preferably 10 to 100 μm.

The sensitive coloring layer in the image-forming material according to the present invention may be a single layer in itself, but it may be composed of two layers: a coloring layer comprising at least a colorant and a binder, and a sensitive layer comprising at least a sensitive composition and a binder. In the case of the two layers, either of the said two layers may be positioned on the release layer side. In the following description of the invention, the case where the sensitive coloring layer is a single layer, was taken up and discussed. Therefore, when the term "sensitive layer" is used in the following description, it means a sensitive coloring layer unless otherwise noted.

The sensitive layer may contain photopolymerizable compositions (for negative sensitive layer), quinonediazide compounds (for positive sensitive layer), diazo compounds (for negative sensitive layer), agide compounds (for negative sensitive layer) or the like.

In case of forming the sensitive layer with a photopolymerizable composition, such a composition contains a compound having at least one addition-polymerizable group and a photopolymerization initiator activated by exposure to active rays, and if necessary, a heat polymerization inhibitor may be added thereto.

The compounds having at least one addition polymerizable group include polyfunctional vinyl monomers and vinylidene compounds which are capable of forming a polymer upon exposure to light. The vinyl monomers and vinylidene compounds used in the said photopolymerizable composition are preferably unsaturated esters of polyols, especially esters of acrylic acid or methacrylic acid. Concrete examples thereof include, ethylene glycol diacrylate, glycerin triacrylate, polyacrylate, ethylene glycol dimethacrylate, 1,3-propanediol dimethacrylate, polyethylene glycol dimethacrylate, 1,2,4-butanetriol trimethacrylate, trimethylolethane triacrylate, pentaerythritol dimethacrylate, pentaerythritol trimethacrylate, pentaerythritol tetramethacrylate, pentaerythritol diacrylate, pentaerythritol triacrylate, pentaerythritol tetracrylate, dipentaerythritol polyacrylate, 1,3-propanediol diacrylate, 1,5-pentadiol dimethacrylate, bisacrylate and bismethacrylate of polyethylene glycol having a molecular weight of 200 to 400.

The photopolymerization initiator and the heat polymerization inhibitor used in the present invention are not specified, and known compounds can be used therefor.

The quinonediazide compounds usable for forming the sensitive layer in the present invention include esters of o-naphthoquinonediazidosulfonic acid and polycondensed resins of phenols and aldehydes or ketones.

The phenols usable for the said polycondensed resins include monovalent phenols such as phenol, o-cresol, m-cresol, p-cresol, 3,5-xylenol, carvacrol and thymol; divalent phenols such as catechol, resorcin and hydroquinone; and trivalent phenols such as pyrogallol and phloroglucin.

The aldehydes usable for the said polycondensed resins include formaldehyde, benzaldehyde, acetaldehyde, crotonaldehyde, furfural and the like. Of these aldehydes, formaldehyde and benzaldehyde are preferred.

The ketones usable for polycondensed resins include acetone and methyl ethyl ketone.

Examples of the said polycondensed resins include phenol- formaldehyde resin, m-cresol-formaldehyde resin, m- and p-mixed cresol-formaldehyde resin, resorcin-benzaldehyde resin and pyrogallol-acetone resin.

The condensation percentage of o-naphthoquinonediazidosulfonic acid to the OH groups of phenols of the said o-napththoquinonediazide compound (the reaction percentage based on one OH group) is preferably within the range from 15 to 80%, more preferably from 20 to 45%.

The high-molecular weight compounds containing the said o-quinonediazide compound used in the present invention are of a weight-average molecular weight of preferably not less than 1,000, more preferably not less than 1,500, still more preferably 1,500 to 10,000.

Examples of the o-quinonediazide compounds usable in the present invention include the compounds disclosed in Japanese Patent Application Laid-open (KOKAI) No. 58-43451. Also, condensation products composed of 2,3,4- trihydroxybenzophenone, 2,3,4,4'-tetrahydroxybenzophenone, 2,3,4,2',4'-pentahydroxybenzophenone, 2,3,4,3',4',5'-hexahydroxybenzophenone or the like and orthoquinonediazidosulfonic acid are usable. Of these o-quinonediazide compounds, 1,2-naphthoquinonediazidosulfonyl chloride-pyrogallol acetone condensation resin, condensation products of 1,2-naphthoquinonediazidosulfonyl chloride with a novolak resin, or o-quinonediazide ester compounds obtained by reacting 1,2-naphthoquinonediazidosulfonyl chloride and 2,3,4-trihydroxybenzophenone are preferred.

As the o-quinonediazide compound used in the present invention, the above-mentioned compounds may be used singly or as a mixture of two or more.

Such an o-quinonediazide compound is used in an amount of preferably 10 to 40 parts by weight based on 100 parts by weight of the binder in the sensitive layer.

Typical examples of the diazo compounds usable for the sensitive layer in the present invention are the condensation products of p-diazodiphenylamine and formaldehyde, preferably those insoluble in water and soluble in ordinary organic solvents such as disclosed in Japanese Patent Application Publication (KOKOKU) Nos. 47-1167 and 57-43890.

Preferred examples of the azide compounds usable for the said sensitive layer are aromatic diazide compounds in which azide groups are bonded to the aromatic rings directly or through carbonyl or sulfonyl groups, which include, for example, polyazidostyrene, polyvinyl-p-azidobenzoate and polyvinyl-p-azidobenzal such as disclosed in U.S. Pat. No. 3,096,311; reaction products of azidoarylsufonyl chloride and unsaturated hydrocarbon-based polymers such as disclosed in Japanese Patent Publication (KOKOKU) No. 45-9613; and polymers having sulfonylazide or carbonylazide such as disclosed in Japanese Patent Publication (KOKOKU) Nos. 43- 21017, 44-22954 and 45-24915.

Other negative-type sensitive compositions include compounds containing the derivatives of cinnamic acid, for example, polyesters and polyamides containing —C=C—CO— groups such as disclosed in U.S. Pat. No. 3,453,237, and cinnamic esters of hydroxy-containing polymers such as polyvinyl alcohol and cellulose disclosed in U.S. Pat. No. 2,732,301.

Typical examples of the binder resins used for the sensitive layer are novolak resins, acrylic resins, vinyl acetate resins, polyurethane resins and epoxy resins.

The novolak resins include phenol-cresol-formaldehyde copolycondensation resin such as disclosed in Japanese Patent Application Laid-Open (KOKAI) No. 55-57841, copolycondensation resins of p-substituted phenol, formaldehyde and phenol or cresol such as disclosed in Japanese Patent Application Laid-Open (KOKAI) No. 55-127553. Preferred examples of the vinyl acetate resins are the vinyl acetate-vinyl versatate copolymers disclosed in Japanese Patent Application Laid-Open (KOKAI) Nos. 3-48248 and 3-181947.

An appropriate colorant is contained in the sensitive layer. As the colorant, dyes and pigments such as yellow, magenta, cyan and black; other metal powders; white pigment; and fluorescent pigment can be used. Listed below are some examples of many pigments and dyes known in the art and usable as colorant in the present invention. (C.I. is abbreviation for color index).

Victoria Pure Blue (C.I. 42595)
Auramine (C.I. 41000)
Rhodamine 6GCP (C.I. 45160)
Rhodamine B (C.I. 45170)
Safranine OK70:100 (C.I. 50240)
Erioglaucine X (C.I. 42080)
Fast Black HB (C.I.26150)
No. 1201 Lionol Yellow (C.I. 21090)
Lionol Yellow GRO (C.I. 21090)
Symuler Fast Yellow 8GF (C.I. 21105)
Benzidine Fellow 4T-564D (C.I. 21095)
Symuler Fast Red 4015 (C.I. 12355)
Lionol Red 7B4401 (C.I. 15830)
Fastogen Blue TGR-L (C.I. 74160)
Lionol Blue SM (C.I. 26150)
Mitsubishi Carbon Black MA-100 (produced by Mitsubishi Chemical Corp.)
Mitsubishi Carbon Black #30, #40 and #50 (produced by Mitsubishi Chemical Corp.)
Cyanine Blue 4920 (produced by Dainichi Seika Co., Ltd.) Seika Fast Carmine 1483 (produced by Dainichi Seika Co., Ltd.)
Seika Fast Yellow H-7005, 2400 (produced by Dainichi Seika Co., Ltd.)

The amount of the colorant to be contained in the sensitive layer is decided in consideration of the target optical density and sensitive layer removability by the developing solution. For example, in case of using a dye, its content in the sensitive layer is preferably 5 to 75% by weight, more preferably 5 to 50% by weight, and in the case of a pigment, its content is preferably 5 to 90% by weight, more preferably 5 to 50% by weight.

The sensitive layer thickness is decided by taking into consideration the target optical density, the kind of the colorant (dye, pigment or carbon black) used for the sensitive layer and its content. Generally, the smaller the layer thickness, the higher is the resolving power, hence better image quality. Therefore, the layer thickness is preferably selected to fall in the range from 0.1 to 5 $\mu$m.

The sensitive layer may contain, in addition to the materials mentioned above, the appropriate additives such as plasticizer, coating property improver, etc.

As plasticizer, various kinds of low-molecular weight compounds such as phthalic acid esters, triphenyl phosphates, maleic acid esters, etc., can be used. As coating property improver, the surfactants, for example, nonionic surfactants such as ethyl cellulose, polyalkylene ether, etc., fluorine-based surfactants and the like can be used.

The sensitive layer can be formed usually by dissolving a sensitive composition and if necessary a colorant and an appropriate binder in a suitable solvent to prepare a coating solution, and applying this coating solution on a release layer.

As the solvents usable for preparing a coating solution, methyl lactate, ethyl lactate, methyl ethyl ketone, cyclohexanone, ethylene dichloride, dichloromethane, acetone, methyl isobutyl ketone, ethyl acetate, ethylene glycol monomethyl ether, ethylene glycol monomethyl ether acetate, ethylene glycol monoethyl ether, ethylene glycol monoethyl ether acetate, N,N-dimethylformamide, dimethyl sulfoxide, N,N-dimethylacetamide, acetylacetone, dioxane, tetrahydrofuran, $\gamma$-butyrolactone, propylene glycol monomethyl ether, propylene glycol monoethyl ether acetate, propylene glycol monoethyl ether acetate, diethylene glycol dimethyl ether, and diethylene glycol diethyl ether may be exemplified. Of these, methyl lactate, methyl ethyl ketone and mixtures of methyl lactate or methyl ethyl ketone with other solvents are preferred.

For forming the said sensitive coloring layer on a release layer, various known coating methods such as roll coating, reverse roll coating, dip coating, air knife coating, gravure coating, gravure offset coating, hopper coating, blade coating, rod coating, wire doctor coating, spray coating, curtain coating and extrusion coating can be used.

For providing a plural number of layers as in case the sensitive coloring layer comprises two layers, viz. a coloring layer and a sensitive layer, or in case an overcoat layer is further provided on the sensitive coloring layer, there can be used, for example, a successive multilayer coating method in which coating, drying and take-up are performed for every layer, or a method in which a plurality of coators and dryers are respectively provided in juxtaposition on one line so that a plural number of layers may be formed by a single operation of support carriage (such as disclosed in Japanese Patent Application Laid-Open (KOKAI) No. 63-69574).

Drying can be accomplished by blowing hot air against the coating surface. Heating temperature is preferably in the range from 30° to 200° C., more preferably from 40° to 140° C. There is generally used a method in which the sensitive coloring layer is dried with the heated air temperature kept constant, but a method in which the heated air temperature is raised stepwise can also be used. Heated air is supplied on the coating surface at a rate of preferably 0.1 to 30 m/sec, more preferably 0.5 to 20 m/sec.

In the present invention, an overcoat layer is provided for the purposes of preventing adhesion of dust, etc., to the sensitive coloring layer, protecting the layer against scratches and other damages, and preventing the influence of oxygen in case a photopolymerizable substance is contained in the sensitive coloring layer. Such an overcoat layer is preferably composed of a material which is soluble or swellable in the usually used developing solution.

Examples of the materials soluble or swellable in the developing solution and usable for the said overcoat layer include polyvinyl alcohol, polyethylene oxide, polyacrylic acid, polyacrylamide, polyvinyl methyl ether, polyvinyl pyrrolidone, polyamide, gum arabic, glue, gelatin, casein, celluloses (viscose, methyl cellulose, ethyl cellulose, hydroxyethyl cellulose, hydroxypropylmethyl cellulose, carboxymethyl cellulose, etc.), and starches (soluble starch, modified starch, etc.).

The overcoat layer in the present invention contains a release agent. There can be used the known release agents, for example, modified silicones such as amino-modified silicone, epoxy-modified silicone, carboxy-modified silicone, alcohol-modified silicone, (meth)acryl-modified silicone, mercapto-modified silicone, phenol-modified silicone, polyether-modified silicone, methylstyryl-modified silicone, alkyl-modified silicone, higher fatty acid ester-modified silicone, higher alkoxy-modified silicone and alkyl fluoride-modified silicone; anionic surfactants such as fatty acid soap, N-acylamino-acid and its salts, alkyl ether carboxylates, acylated peptide, alkylbenzene sulfonate, alkylnaphthalene sulfonate, naphthalene sulfonate-formaldehyde condensate, dialkylsulphosuccinic acid ester salt, alkylsulfoacetate, α-olefinsulfonate, N-acylmethyltaurine, sulfonated oil, higher alcohol sulfuric acid ester salt, secondary higher alcohol sulfuric acid ester salts, alkyl ether sulfonate, secondary higher alcohol ethoxysulfate, polyoxyethylenealkylphenyl ether sulfate, monoglysulfate, sulfuric ester salt of fatty acid alkylolamide, alkyl ether phosphoric ester salt, and alkyl phosphoric ester salt; cationic surfactants such as fatty acid amine salt, aliphatic quaternary ammonium salt, benzalconium salt, benzethonium chloride, pyridinium salt, and imidazolium salt; ampholytic surfactants such as alkyldimethylbedain, aminocarboxylate and imidazoliumbedain; nonionic surfactants such as polyoxyethylene alkyl ether, single-chain-length polyoxyethylene alkyl ether, polyoxyethylene secondary alcohol ether, polyoxyethylene alkylphenyl ether, polyoxyethylene styrol ether, polyoxyethylene lanolin derivatives, ethylene oxide derivatives of alkylphenol-formaldehyde condensate, polyoxyethylene-polyoxypropylene block polymer, polyoxyethylene-polyoxypropylene alkyl ether, polyoxyethylene glycerin fatty acid ester, polyoxyethylene castor oil, hardened castor oil, polyoxyethylene sorption fatty acid ester, polyoxyethylene orbital fatty acid ester, polyoxyethylene glycol fatty acid ester, fatty acid monoglyceride, polyglycerin fatty acid ester, sortiban fatty acid ester, propylene glycol fatty acid ester, fatty acid alkanolamide, polyoxyethylene fatty acid amide, polyoxyethylene alkylamine, and alkylamine oxide; and fluorine-based surfactants such as fluoroalkylcarboxylic acid, n-perfluorooctanesulfonyl glutaminate, 3-(fluoroalkyloxy)-1-alkylsufonate, 3-(ω-fluoroalkanoyl-N-ethylamino)-1-propane sulfonate, N-(3-(perfluorooctanesulfoneamide)propyl)-N,N-dimethyl-N-carboxymethyleneammoniumbetaine, fluoroalkylcarboxylic acid, perfluoroalkylcarboxylic acid, perfluorooctanesulfonic acid diethanolamide, perfluoroalkyl sulfonate, N-propyl-N-(2-hydroxyethyl)perfluorooctanesulfoneamide, perfluoro-alkylsulfoneamidepropyl trimethylammonium salt, perfluoroalkyl-N-ethylsulfonyl glycine salt, bis(N-perfluorooctylsulfonyl-N-ethylaminoethyl)phosphate, monoperfluoroalkylethyl phosphoric acid ester, perfluoro-alkylpolyoxyethylene ethanol, alkyl fluoride, and perfluoroalkyl quaternary ammonium salt.

The problems mentioned above can be solved by incorporating these release agents in the overcoat layer.

For an image-forming material used in a transfer system in which the image portion alone is transferred, it is necessary to reduce adhesiveness (that is, to enhance releasability) between the sensitive coloring layer and the release layer for facilitating transfer of the image alone from the release layer to a transfer material in the transfer operation under heating. On the other hand, development must be performed with the overcoat layer, which has been laid bare by peeling the protective film at the protective film/overcoat layer interface, after exposure. If the peeling force at the protective film/overcoat layer interface is stronger than the peeling force at the sensitive coloring layer/release layer interface or the peeling force at the overcoat layer/sensitive sensitive layer interface, exfoliation of parts other than the protective film/overcoat layer interface may occur, when the protective film is peeled after exposure to the image-forming material, resulting in formation of a defective final image. Addition of a release agent such as mentioned above in the overcoat layer can reduce the peeling force at the protective film/overcoat layer interface alone to solve the problem of defective image formation.

It is to be also noted that if the peeling force at the protective film/overcoat layer interface is large, the image-forming material is statically charged due to "peel charge". Such static charge causes entangling of the image-forming material on the treating equipment in the ensuing transfer step, exerting an immoderate force to the image-forming material to cause a positional deviation. Such positional deviation can be minimized by lowering the peeling force by the addition of a release agent.

As the release agent used in the present invention, release agents of which the surface tension of a 1 wt % aqueous solution is not more than 30 dynes/cm, more preferably not more than 28 dynes/cm, are preferred. The surface tension of the overcoat layer can be reduced by incorporating such a release agent in the overcoat layer. Use of such a release agent can improve coating properties of the overcoat layer not only on the polyethylene terephthalate film but also on other films having a low free-energy surface such as polyolefin (polyethylene, polypropylene, etc.) films. If the coating properties of the overcoat layer are bad, the period of elution of the overcoat layer into the developing solution becomes nonuniform locally, and accordingly the net time of development of the sensitive coloring layer differs locally, resulting in nonuniform development which in turn causes formation of the final image. Thus, the incorporation of a release agent has the effect of improving the quality of the finally produced image through the improvement of coating properties of the overcoat layer.

The release agent used in the present invention is preferably of an aqueous type such as water-dispersible or water-soluble type, more preferably one with such a degree of water solubility that the release agent is uniformly dissolved to form a transparent solution when prepared into a 5 wt % aqueous solution. It is even more preferable to use a release agent which is capable of forming a uniform transparent solution when the release agent is prepared into a 20 wt % aqueous solution. If the release agent contained in the overcoat layer has low solubility in water, nonuniform drying may take place in the step of coating and drying of the overcoat layer, making it unable to form a uniform overcoat layer. This causes local nonuniformity in the period of elution of the overcoat layer into the developing solution, hence local variation of the net time of development of the sensitive coloring layer, resulting in nonuniform development and imperfection of the final image.

Preferred among these release agents are the polyether-modified silicones such as polyoxyethylene-modified silicone, polyoxypropylene-modified silicone and polyoxyethylene-polyoxypropylene-modified silicone, and the fluorine-based surfactants such as potassium salt of perfluoroalkylcarboxylic acid, quaternary ammonium salt of perfluoroalkyl, perfluoroalkylpolyoxyethylene ethanol and potassium salt of perfluoroalkylsulfonic acid. Examples of such preferred release agents include those commercially available under the trade names of SILWET L-7002, SILWET L-7600, SILWET L-7602, SILWET L-7604 and SILWET L-7607N (Nippon Unicar Co., Ltd.), Florad FC12, Florad FC135, Florad FC170C, Florad FC95, and Florad FC171 (3M Co., Ltd.). Of these, polyether-modified silicones are most preferred.

The content of the release agent in the overcoat layer is 0.5 to 20% by weight, preferably 1 to 10% by weight. When the content is less than 0.5% by weight, there may take place partial loss of the image and generation of static charge on release of the layer. When the content exceeds 20% by weight, the coating properties of the overcoat layer tend to deteriorate, causing nonuniform coating on the surface.

It is also recommended that an ultraviolet absorber be present in the overcoat layer. Incorporation of an ultraviolet absorber lessens the possibility of causing halation on image exposure, allowing formation of an image closer to the print. It is possible to use the known types of ultraviolet absorber as far as they exert no adverse effect to the developing property and coating property. As the ultraviolet absorbers usable in the present invention include stilbenes, salicylic acids, benzophenones, benzotriazoles and cyanoacrylates ultraviolet absorbers may be exemplified.

Listed below are the preferred examples of these ultraviolet absorbers:

Sodium 4,4'-bis-2-diethylamino-4-(2,5-disulfophenylamino)-s-triazyl-6-aminostilbene-2,2'-disulfonate (trade name: Tinopal SFP),
p-tert-Butylphenyl salicylate (trade name: Sumisorb 90),
-Octylphenyl salicylate (trade name: OPS),
2,4-Dihydroxybenzophenone,
2-Dihydroxy-4-methoxybenzophenone,
2-Hydroxy-4-octoxybenzophenone (trade name: Sumisorb 130),
2-Hydroxy-4-dodecyloxybenzophenone (trade name: AM-320),
2,2'-Dihydroxy-4-methoxybenzophenone (trade name: Cyasorb UV-24),
2,2'-Dihydroxy-4,4'-methoxybenzophenone (trade name: ASL-40),
2-Hydroxy-4-methoxy-5-sulfobenzophenone (trade name: Cyasorb UV-284),
2-(2'-Hydroxy-5'-methylphenyl)benzotriazole (trade name: Sumisorb 200),
2-(2'-Hydroxy-5'-tert-butylphenyl)benzotriazole (trade name: Tinuvin-PS),
2-(2'-Hydroxy-3',5'-di-tert-butylphenyl)benzotriazole (trade name: Tinuvin-320),
2-(2'-Hydroxy-3'-tert-butyl-5'-methylphenyl)-5-benzotriazole (trade name: Sumisorb-300),
2-(2'-Hydroxy-3',5'-di-tert-butylphenyl)-5-chlorobenzotriazole (trade name: Tinuvin-327),
2-(2'-Hydroxy-3',5'-di-tert-aminophenyl)benzotriazole (trade name: Sumisorb-350),
2-(2'-Hydroxy-3',5'-bis($\alpha,\alpha'$-dimethylbenzyl)phenyl)-5-chlorobenzotriazole (trade name: Tinuvin-234).

Of these ultraviolet absorbers, stilbenes, benzophenones and benzotriazoles ultraviolet absorbers are preferred. These ultraviolet absorbers may be used either singly or as a mixture of two or more. Further, the aqueous types such as water-dispersible ultraviolet absorbers and water-soluble ultraviolet absorbers are preferred. It is more preferable to use an ultraviolet absorber with such a degree of water solubility that when prepared into a 5 wt % aqueous solution, the agent is uniformly dissolved to form a transparent solution, and it is still more preferable to use an ultraviolet absorber which is capable of forming a uniform transparent solution when prepared into a 10 wt % aqueous solution.

The overcoat layer usually has the property that it is dissolved or swollen in a water-based solvent, so that an aqueous ultraviolet absorber can be uniformly dissolved in the overcoat layer to display its maximal effect.

The content of the ultraviolet absorber in the overcoat layer is decided by taking into consideration the kind of the light source used, absorption wavelength of the sensitive material and its absorption strength, but in the present invention, the content of the ultraviolet absorber in the overcoat layer is not more than 500 mg based on 1 $m^2$ of the overcoat layer, preferably from 1 to 500 mg based on 1 $m^2$ of the overcoat layer, more preferably from 20 to 200 mg based on 1 $m^2$ of the overcoat layer.

In the present invention, a protective film is provided on the said overcoat layer. This protective film is provided for protecting the surfaces of the sensitive coloring layer and the overcoat layer and for preventing occurrence of deformation of the sensitive coloring layer when the image portion alone is transferred to a transfer material.

Films and sheets having excellent mechanical properties and surface characteristics can be used as the said protective film. For instance, the equivalents to the said transparent supports can be used. In this case, the film thickness is in the range from 1 to 200 µm, preferably from 5 to 100 µm.

The method of producing the image-forming material according to the present invention is not critical. There can be used a method in which the respective layers are formed successively on a support as described above, but a method comprising producing a film having an overcoat layer on a protective film, then forming a sensitive coloring layer on a support, and laminating them in the usual way is preferred since a flat and smooth film can be obtained easily with this method.

In this case, it is recommended to use a release agent with a small surface tension as described above for forming a uniform overcoat layer. The coating method may be properly selected from those applicable to the sensitive layer mentioned above.

A method of forming a multicolor image (a four-color image in this case) using the image-forming materials according to the present invention is described below, but the present invention is not limited to this example.

First, the color image-forming material corresponding to a first color is attached fast to the associated color separation film, and then light such as ultraviolet light is applied thereto to effect image exposure. As light source, there can be used, for example, mercury lamp, ultra-high pressure mercury lamp, metal halide lamp, tungsten lamp, xenon lamp, fluorescent lamp and the like. The similar operation is repeated for the remaining three colors.

The protective film is peeled away from each of the exposed materials, and is developed, washed with water and dried to form the image portion.

The thus formed image portion is then transferred to a transfer material to obtain a transfer image. In this case, it is recommended to use a transfer system in which the formed image portion alone is transferred, because it is possible with this system to obtain a transfer image very close to the print.

Thus, the color image of a first color is formed on a first color image-forming material, and at least this color image is transferred to a transfer material, after which the support is separated. Then the color image of a second color is formed on a second color image-forming material, the thus formed second color image is transferred with registering on the transfer material to which the first color image has already been transferred, and then the support is separated to obtain a two-color-matched image. The images of the third and fourth colors (if necessary the images of a greater number of colors) are likewise transferred onto the same transfer material to obtain a multicolor image.

In some cases, this multicolor image may be indirectly transferred onto other transfer material to obtain a final multicolor image. The techniques relating to this type of method are disclosed in Japanese Patent Application Laid-Open (KOKAI) Nos. 47-41830, 59-97140 and 60-23649, and U.S. Pat. No. 3,775,113. It is possible to use a system in which from the image formed on the support, the image portion alone is directly transferred and laminated on a transfer material. It is preferable that only the image layer, in which the image is substantially formed, be transferred and laminated.

As for the transfer method, it is recommendable to use, for example, the method disclosed in Japanese Patent Application Laid-Open (KOKAI) No. 3-120552. In this method, only the image layer where the image is substantially formed is transferred and also the image is transferred directly to the transfer paper, so that this method is one step less than the said indirect transfer method, and accordingly the working time is shortened. Also, since this method can dispense with use of an adhesive image receiving sheet which is essential in indirect transfer, the work for registering the image receiving sheet and the image-formed support is facilitated to realize an improvement of work efficiency.

The transfer operation is usually carried out under heating and/or pressure. The heating temperature and pressure applied vary greatly depending on the layer structure and the compositions constituting the respective layers. Usually, the temperature of the heat applied in the transfer operation is in the range from room temperature to 140° C. and the pressure is in the range from 0 to around 20 kg/cm$^2$ G, but in the present invention, preferably the temperature is in the range from 70° to 100° C. and the pressure in the range from 3 to 10 kg/cm$^2$ G. These operating conditions can be implemented by various known means. For example, they can be fulfilled by passing the laminate between the heated rolls such as described in Japanese Patent Application Laid-Open (KOKAI) No. 62-80658. The method shown in aforementioned Japanese Patent Application Laid-Open (KOKAI) No. 3-120552 is also recommendable.

Various methods are available for register. For example, a support having an image formed thereon is attached fast on an adhesive support to fix the image, thereby preventing positional discrepancy, or register is performed with a register pin bar by making use of the pin hole used for fixing the color-separated original at the time of exposure. The former method is discussed in Japanese Patent Application Laid-Open (KOKAI) Nos. 63-78788, 2-19148, etc. In the present invention, a register pin bar methods are preferred.

As the image-receiving material, there can be used papers such as slick paper, art paper, coated paper, etc.; plastic films such as polyester film, acetate film, etc.; plastic films having coated thereon an intermediate layer and an image-receiving layer; metal foils such as aluminum foil; copper foil; or composites thereof.

EXAMPLES

The present invention will be described in more detail with reference to the examples and comparative examples. It will be understood, however, that these examples are merely intended to be illustrative and not to be construed as limiting the scope of the invention.

Example 1

<Support>

An ethylene-vinyl acetate copolymer resin (EVAFLEX P-1405, produced by Mitsui Dupont Polychemical Co., Ltd.; vinyl acetate content: 14% by weight, VICAT softening point: 68° C.) was laminated on a 75 µm-thick biaxially oriented polyethylene terephthalate film (65 cm in width) by extrusion laminating method to form a 25 µm-thick release layer.

<Formation of sensitive layer>

On the said support, the sensitizing solutions of four colors of the compositions specified below were applied by using a bar coater and dried to form a sensitive coloring layer having a dry thickness of 1.5 µm.

Composition of negative sensitive layer coating solution

| | |
|---|---|
| Vinyl acetate-vinyl versatate copolymer (80:20 (in wt %); weight-average molecular weight: 150,000; a 50% methanol solution) | 10 parts by weight |
| Pentaerythritol tetraacrylate | 6 parts by weight |

-continued

| | |
|---|---|
| 2,4-Diethylthioxanetone | 1.2 part by weight |
| Ethyl 4-dimethylaminobenzoate | 1.2 part by weight |
| Bis-(2-(3'-chloro)-4,6-diphenyl imidazole | 0.5 part by weight |
| Paramethoxyphenol | 0.2 part by weight |
| 2-Butanone | 64 parts by weight |
| Pigments specified below | |
| Pigments | |
| Black: Carbon Black MA-100 (Mitsubishi Chemical Corp.) | 1.65 part by weight |
| Cyan: Cyanine Blue 4920 (Dainichi Seika Co., Ltd.) | 1.2 part by weight |
| Magenta: Seika Fast Carmine 1483 (Dainichi Seika Co., Ltd.) | 2.5 parts by weight |
| Yellow: Seika Fast Yellow 2400 (Dainichi Seika Co., Ltd.) | 1.65 part by weight |

On a 25 μm-thick biaxially oriented polyethylene terephthalate film (70 cm in width), an overcoating solution of the following composition was coated by a bar coater and dried to make the dry layer thickness 0.5 μm. This overcoated film and the previously formed sensitive layer-coated film were placed one over the other, so that the coated sides of the films would face each other and laminated under pressure to make an image-forming material. The surface tension (at 25° C.) of a 1% aqueous solution of SILWET L-7607N (polyether-modified silicone, produced by Nippon Unicar Co., Ltd.) used as release agent was 22.0 dynes/cm. In order to confirm solubility of the ultraviolet absorber in water, 100 g of Tinopal SFP (produced by Ciba Geigy AG) was added to 1,000 g of 25° C. water and stirred for 10 minutes. The compound was dissolved uniformly to form a transparent solution.

| Composition of overcoating solution | |
|---|---|
| Polyvinyl alcohol (GL-05 produced by Nippon Gosei Kagaku Kogyo Co., Ltd.) | 1.0 part by weight |
| Hydroxypropyl methyl cellulose (TC-5 produced by Shin-Etsu Chemical Industry Co., Ltd.) | 1.0 part by weight |
| Release agent (SILWET L-7607N available from Nippon Unicar Co., Ltd.) | 0.1 part by weight |
| Ultraviolet absorber (Tinopal SFP produced by Ciba Geigy AG) | 1.0 part by weight |
| Desalted water | 97.0 parts by weight |
| Methanol | 3.0 parts by weight |

Formation of transfer image

The four-color pigmented image-forming material obtained in the manner described above was sliced into a piece with a size of 910 mm×620 mm, and the registering holes were formed by a puncher (mfd. by Stoesser Register Systems). Then the A-1 sized color separation films for the respective colors were placed on the polyethylene terephthalate film side of the said material and exposed at the maximal exposure dose using a bright room printer P-647-GA (mfd. by Dai-Nippon Screen Co., Ltd.) for 60 seconds while conducting register with a pin bar (mfd. by Stoesser Register Systems). After separating the protective film from the pigmented image-forming material, the latter was immersed in the developing solution specified below at 32° C. for 30 seconds to form a four-color image. No abnormality was seen on the overcoat layer surface after removal of the protective film.

| Developing solution | |
|---|---|
| Sodium silicate | 25 g |
| Sodium hydroxide | 5 g |
| Surfactant (Pelex NBL produced by Kao Corp.) | 250 g |
| Desalted water | 1,000 g |

Using the four sheets on which the said color image has been formed, a four-color transfer image was formed on an art paper according to the method described in Example 1 using the apparatus described in Japanese Patent Application Laid-Open (KOKAI) No. 3-120552 (U.S. Pat. No. 5,068, 689) under the conditions of a drum temperature of 70° C. a press roll temperature of 110° C. and a roll pressure of 4 kg/cm$^2$. The obtained image showed excellent transferability and was strikingly similar to the print image formed by ordinary offset printing.

The obtained print was evaluated regarding the following items.

Positional deviation

Using the four sheets on which the said coloring image has been formed, a four-color image was formed on a 636 mm×939 mm specific art paper (basis weight: 127.9 g/cm$^2$) according to the method described in Example 1 of Japanese Patent Application Laid-Open (KOKAI) No. 3-120552, and the portion where the greatest positional deviation occurred among the colors was observed under a microscope of 100 magnifications. The maximal positional deviation was less than 100 μm.

In the present invention, it is required that the positional deviation be less than 180 μm, preferably less than 150 μm.

Releasability

There were prepared 10 sheets of coloring image-forming material sliced to a size of 910 mm×620 mm, and they were exposed by the above-described method at the maximal exposure dose for 60 seconds using a film printer P-647-GA (mfd. Dai-Nippon Screen Co., Ltd.). After separating the protective film, the overcoat layer surface was observed, determining how many out of the 10 sheets of coloring image-forming material have suffered exfoliation at the interface between the release layer and the sensitive layer on the support. Rating was made according to the following criterion: "more excellent" when none of the 10 sheets suffered exfoliation; "excellent" when only one of the 10 sheets suffered exfoliation; "good" when two sheets suffered exfoliation; and "bad" when three or more sheets suffered exfoliation. The result of releasability evaluation of the said print showed that none of the 10 sheets of pigmented image-forming material suffered exfoliation at the interface between the release layer and the sensitive layer on the support, marking the rating of "more excellent".

In the present invention, it is essential that the releasability is ether "more excellent" or "excellent".

Comparative Example 1

A negative image-forming material was made by following the same procedure as in Example 1 except that the composition of the overcoating solution was changed as shown below, and a transfer image was formed on an art paper in the same way.

| Composition of overcoating solution | |
| --- | --- |
| Polyvinyl alcohol (GL-05, produced by Nippon Gosei Kagaku Kogyo Co. Ltd.) | 1.0 part by weight |
| Hydroxypropyl methyl cellulose (TC-5, produced by Shin-Etsu Chemical Industry Co., Ltd.) | 1.0 part by weight |
| Desalted water | 97.0 parts by weight |
| Methanol | 3.0 parts by weight |

When the protective film was peeled after exposure, exfoliation was partly observed not at the interface between the protective film and the overcoat layer but at the interface between the release layer and the sensitive layer on the support, and these parts of exfoliation turned out a defect of the final image in the form of partial loss of the image. During peel of the protective film, there took place vigorous generation of static electricity with a sound of peel. The worker often felt an electric shock due to static electricity during the work and had difficulties in continuing the work. The result of releasability evaluation described in Example 1 was "bad". In rating of positional deviation according to the method shown in Example 1, the greatest positional deviation among four colors was more than 200 $\mu$m.

When four sheets of image-forming material for four colors, after exposure and development, were placed one over another by using the said pin bar and the portion of the greatest positional deviation among four colors was observed, the positional deviation was less than 30 $\mu$m, and it was found that such positional deviation occurred in the transfer step.

Example 2

A negative image-forming material was made by following the procedure of Example 1 except that the release agent in the overcoating solution was changed to SILWET L-5310 (a polyether-modified silicone, produced by Nippon Unicar Co., Ltd.), and a transfer image was formed on an art paper in the same way. The surface tension (at 25° C.) of a 1% aqueous solution of the said release agent was 30.5 dynes/cm. The result of releasability evaluation according to the method of Example 1 was "excellent". As for the positional deviation also determined according to the method of Example 1, the greatest positional deviation among four colors was 150 $\mu$m. When four sheets of image-forming material for four colors after exposure and development were placed one over another by using the said pin bar and the portion of greatest positional deviation among four colors was observed, the positional deviation was less than 30 $\mu$m.

Comparative Example 2

On the sensitive layer side of a film having a four-color sensitive layer coating as in Example 1, an overcoating solution same as used in Example 1 was applied to a dry coating thickness of 0.5 $\mu$m by using a bar coater and dried to make an image-forming material. Thus, the image-forming material of this comparative example is identical with that of Example 1 except that the former had no protective film. Exposure, development and transfer were carried out in the same way as in the said Examples to form a four-color transfer image on an art paper. When the overcoat layer surface after exposure was observed, there was seen a slight deformation which seemed to be an imprint of the exposure cover, which remained as a defect (partial loss of image) on the final image. In measurement of positional deviation according to the method of Example 1, the greatest positional deviation among four colors was greater than 200 $\mu$m.

When four sheets of image-forming material for four colors after exposure and development were placed on over another by using the said pin bar and the portion where the greatest positional deviation among four colors occurred was observed, the positional deviation in that portion was about 150 $\mu$m, and it was found that such positional deviation occurred during exposure.

Example 3

A positive image-forming material was made by following the same procedure as Example 1 except that the sensitive layer was replaced by a positive type specified below, and a transfer image was formed on an art paper in the same way.

| Composition of positive sensitive layer coating solution | |
| --- | --- |
| 1,2-Naphthoquinonediazido-4-sulfonic acid ester of 2,3,4-trihydroxy-benzophenone | 0.62 part by weight |
| Vinyl acetate-vinyl versatate copolymer (80:20 (in wt %); weight-average molecular weight: 50,000; 50% methanol solution) | 8.77 parts by weight |
| Pigments specified below | |
| 2-Butanone | 35.2 parts by weight |
| Pigments: | |
| Black: Carbon Black MA-100 (Mitsubishi Chemical Corp.) | 0.99 part by weight |
| Cyan: Cyanine Blue 4920 (Dainichi Seika Co., Ltd.) | 0.55 part by weight |
| Magenta: Seika Fast Carmine 1483 (Dainichi Seika Co., Ltd.) | 0.68 part by weight |
| Yellow: Seika Fast Yellow 2400 (Dainichi Seika Co., Ltd.) | 0.68 part by weight |

Observation of the overcoat layer surface after separation of the protective film showed no abnormality. Thus, the obtained image had good transferability and was closely analogous to the image formed by ordinary offset printing. The result of the releasability evaluation according to the method of Example 1 was "more excellent". In determination of positional deviation according to the method of Example 1, it was found that the positional deviation at the portion of greatest positional deviation among four colors was less than 100 $\mu$m.

Example 4

A negative image-forming material was made by following same procedure as Example 1 except that no ultraviolet absorber was contained in the composition of the overcoating solution, and a transfer image was formed on an art paper in same way. The result of the releasability evaluation according to the method of Example 1 was "excellent". Determination of positional deviation according to the method of Example 1 showed that the obtained image had good transferability, and it was similar to the image of the print formed by ordinary offset printing. Positional deviation at the portion of the greatest positional deviation among four colors was less than 100 $\mu$m.

What is claimed is:

1. A process for image-forming, comprising:

exposing an image-forming material to light, peeling a protective film from a sensitive coloring layer, developing said material, and transferring the image portion, which is formed, alone to a transfer material, which image-forming material comprises:
- a support; and
- a release layer, a sensitive coloring layer, an overcoat layer containing a release agent, and a protective film disposed successively in this order on the support such that upon peeling of the protective film from the image forming material after exposure, the protective film alone separates from the remainder of the overcoat layer, the sensitive coloring layer and the release layer.

2. The process for image-forming according to claim 1, wherein the content of the release agent in the overcoat layer is 0.5 to 20% by weight.

3. The process for image-forming according to claim 1, wherein the release agent contained in the overcoat layer is an aqueous release agent.

4. The process for image-forming according to claim 3, wherein the aqueous release agent is at least one member selected from the group consisting of modified silicones, anionic surfactants, cationic surfactants, ampholytic surfactants, nonionic surfactants and fluorine-based surfactants.

5. The process for image-forming according to claim 3, wherein the aqueous release agent is a modified silicone or fluorine-based surfactant.

6. The process for image-forming according to claim 3, wherein the aqueous release agent is an ether-modified silicone.

7. The process for image-forming according to claim 3, wherein the aqueous release agent is one in which the surface tension of a 1 wt % aqueous solution is not more than 30 dynes/cm.

8. The process for image-forming according to claim 1, wherein the overcoat layer contains an ultraviolet absorber.

9. The process for image-forming according to claim 8, wherein the content of the ultraviolet absorber in the overcoat layer is not more than 500 mg based on 1 $m^2$ of the overcoat layer.

10. The process for image-forming according to claim 8, wherein the ultraviolet absorber present in the overcoat layer is an aqueous ultraviolet absorber.

11. The process for image-forming according to claim 1, wherein the release layer contains an ethylene-vinyl acetate copolymer having a softening point of 50° to 120° C.

12. The process for image-forming according to claim 1, wherein the sensitive coloring layer comprises a photopolymerizable composition containing a colorant, a photopolymerization initiator and at least one addition polymerizable monomer compound.

* * * * *